(12) United States Patent
Yumoto et al.

(10) Patent No.: US 11,322,424 B2
(45) Date of Patent: May 3, 2022

(54) INSULATION CIRCUIT BOARD WITH HEAT SINK

(71) Applicant: MITSUBISHI MATERIALS CORPORATION, Tokyo (JP)

(72) Inventors: Ryohei Yumoto, Saitama (JP); Tomoya Oohiraki, Saitama (JP); Takeshi Kitahara, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 17/040,170

(22) PCT Filed: Mar. 27, 2019

(86) PCT No.: PCT/JP2019/013127
§ 371 (c)(1),
(2) Date: Sep. 22, 2020

(87) PCT Pub. No.: WO2019/189329
PCT Pub. Date: Oct. 3, 2019

(65) Prior Publication Data
US 2021/0118769 A1   Apr. 22, 2021

(30) Foreign Application Priority Data
Mar. 28, 2018   (JP) .............................. JP2018-061989

(51) Int. Cl.
*B21D 39/00* (2006.01)
*H01L 23/373* (2006.01)
(Continued)

(52) U.S. Cl.
CPC .......... *H01L 23/3735* (2013.01); *B32B 9/005* (2013.01); *B32B 15/043* (2013.01);
(Continued)

(58) Field of Classification Search
None
See application file for complete search history.

(56) References Cited

U.S. PATENT DOCUMENTS

| 2004/0191558 A1* | 9/2004 | Ishikawa ............... C04B 35/522 |
|---|---|---|
| | | 428/615 |
| 2010/0193801 A1 | 8/2010 | Yamada et al. |
| 2012/0107642 A1* | 5/2012 | Meyer .................. C04B 37/021 |
| | | 428/623 |

FOREIGN PATENT DOCUMENTS

| JP | 2000-281465 A | 10/2000 |
|---|---|---|
| JP | 2004-327711 A | 11/2004 |

(Continued)

OTHER PUBLICATIONS

International Search Report dated Jun. 18, 2019, issued for PCT/JP2019/013127.
(Continued)

*Primary Examiner* — Seth Dumbris
(74) *Attorney, Agent, or Firm* — Locke Lord LLP; James E. Armstrong, IV; Nicholas J. DiCeglie, Jr.

(57) ABSTRACT

An insulated circuit board which is obtained by bonding a circuit layer onto one side of a ceramic substrate, and bonding a metal layer made of copper or copper alloy onto the other side of the ceramic substrate; and a heat sink which is bonded to the metal layer are included; the heat sink has a first metal layer made of aluminum or aluminum alloy joined to the metal layer, a ceramic board material joined to the first metal layer at an opposite side to the metal layer, and a second metal layer made of aluminum or aluminum alloy joined to the ceramic board material at an opposite side to the first metal layer; a thickness T1 of the first metal layer and a thickness T2 of the second metal layer are 0.8 mm to 3.0 mm inclusive; and a thickness ratio T1/T2 is 1.0 or more.

5 Claims, 3 Drawing Sheets

(51) Int. Cl.
    *B32B 9/00*         (2006.01)
    *B32B 15/04*       (2006.01)
    *B32B 15/20*       (2006.01)
    *H01L 21/48*       (2006.01)

(52) U.S. Cl.
    CPC .......... *B32B 15/20* (2013.01); *H01L 21/4857* (2013.01); *H01L 21/4882* (2013.01); *B32B 2307/206* (2013.01); *B32B 2457/08* (2013.01); *Y10T 428/12535* (2015.01)

(56) References Cited

FOREIGN PATENT DOCUMENTS

| | | | | |
|---|---|---|---|---|
| JP | 2010-098057 A | | 4/2010 | |
| JP | 2010098057 A | * | 4/2010 | |
| JP | 2014039062 A | * | 2/2014 | ......... H01L 23/3735 |
| JP | 2014-060215 A | | 4/2014 | |
| JP | 2016-167502 A | | 9/2016 | |
| JP | 2016-189421 A | | 11/2016 | |
| JP | 2017-212316 A | | 11/2017 | |

OTHER PUBLICATIONS

Extended European Search Report issued in EP19775323.9, dated Dec. 1, 2021.

* cited by examiner

INSULATION CIRCUIT BOARD WITH HEAT SINK

BACKGROUND OF THE INVENTION

Technical Field

The present invention relates to an insulation circuit board with a heat sink in which a heat sink is joined to an insulation circuit board such as a power module substrate or the like used for a semiconductor device controlling large current and high voltage. Priority is claimed on Japanese Patent Application No. 2018-061989, filed Mar. 28, 2018, the content of which is incorporated herein by reference.

Background Art

An insulation circuit board with a heat sink, in which a circuit layer is bonded to one side of an insulation layer consisting of aluminum nitride or the other ceramic substrates and an aluminum-based heat sink is bonded to the other side with an aluminum board therebetween, is known.

For example, in an insulation circuit board with heat sink disclosed in Patent Document 1, a circuit layer consisting any of a pure aluminum board, an aluminum alloy board, a pure copper board, a copper alloy board or the like is bonded to one side of an insulating layer consisting of a ceramic substrate, and a metal layer consisting of a metal board of pure aluminum or aluminum alloy is bonded to the other side of the insulating layer; to the metal layer, a heat sink formed from aluminum or aluminum alloy is directly bonded.

In such insulation circuit boards with heat sinks, warping may occur due to the bonding of members with different thermal expansion coefficient, such as a ceramic substrate and an aluminum board. In order to prevent such warping, a composite with a low expansion coefficient, which is formed of a porous silicon carbide formed body disclosed in Patent Document 2 impregnated with a metal composed mainly of aluminum, is examined to be used as a material for the heat sink.

Patent Document 3 discloses a metal-ceramic-joined substrate (an insulation circuit board with a heat sink) formed by joining a first metal board on one side of a first ceramic substrate, joining a second metal board on the other side of the first ceramic substrate and one side of a second ceramic substrate, and joining a board-shape heat dissipation member having a plurality of fins on the other side of the second ceramic substrate. This metal-ceramic-joined substrate is formed by placing the first ceramic substrate and the second ceramic substrate in a carbon-made mold at intervals, and pouring melted aluminum alloy into the mold to cool and solidify it.

CITATION LIST

Patent Document 1: Japanese Unexamined Patent Application, First Publication No. 2014-60125
Patent Document 2: Japanese Unexamined Patent Application, First Publication No. 2000-281465
Patent Document 3: Japanese Unexamined Patent Application, First Publication No. 2017-212316

SUMMARY OF INVENTION

Technical Problem

The metal-ceramic-joined substrate disclosed in Patent Document 3 is manufactured by placing two ceramic substrate in a mold at intervals and pouring melted aluminum alloy into the mold; so that all the metal boards, heat dissipation members and fins are made of the same aluminum alloy.

The present invention is achieved in consideration of the above circumstances, and has an object to suppress warping of an insulation circuit board with a heat sink formed by joining a metal layer of an insulation circuit substrate and a heat sink made of different composition metal.

Solution to Problem

Inventors of this case, by the earnest research, found that deformation of the insulation circuit board with a heat sink owing to bonding a heat sink made of metal having different composition from a metal layer of the insulation circuit board on the metal layer may be a warp in which the insulation circuit board side of the heat sink convex or concave in accordance with various conditions.

An insulation circuit board with a heat sink according to a first aspect of the present invention is provided with an insulation circuit board provided with a ceramic substrate, a circuit layer bonded on one side of the ceramic substrate, and a metal layer made of copper or copper alloy bonded on the other side of the ceramic substrate; and a heat sink bonded on the metal layer. The heat sink has a first metal layer with a thickness $T1$ made of aluminum or aluminum alloy bonded on the metal layer, a ceramic board material bonded on the first metal layer at an opposite side to the metal layer, and a second layer with a thickness $T2$ made of aluminum or aluminum alloy bonded on the ceramic board material at an opposite side to the first metal layer; and the thickness $T1$ of the first metal layer and the thickness $T2$ of the second metal layer are both 0.8 mm to 3.0 mm inclusive and a thickness ratio $T1/T2$ is 1.0 or more.

In the insulation circuit board with a heat sink having such a configuration, it is possible to reduce linear expansion coefficient of the heat sink by disposing the ceramic board material between the first metal layer and the second metal layer which are made of aluminum or aluminum alloy in the heat sink, and it is possible to reduce difference of linear expansion from the insulation board having the metal layer made of copper or copper alloy. Accordingly, it is possible to suppress a warping change amount of the insulation circuit board with a heat sink between at high temperature and at low temperature.

In this insulation circuit board with a heat sink, in a case in which either the thickness $T1$ of the first metal layer or the thickness $T2$ of the second metal layer of the heat sink is less than 0.8 mm, or in a case in which the thickness ratio $T1/T2$ is less than 1.0, the warping change amount is a negative and large value. This means that the insulation circuit board with a heat sink is largely deformed from being convex toward the circuit layer side to being convex toward the heat sink side when changing from high temperature 285° C. to low temperature 30° C. In such a case, compressive stress is applied on an outer peripheral part of solder under an element, so that a bonded rate of the solder under the element is deteriorated when cold/hot cycle is loaded.

Here, if either the thickness $T1$ of the first metal layer or the thickness $T2$ of the second metal layer is more than 3.0 mm, there is a possibility in that the ceramic substrate of the insulation circuit board may be broken in the cold/hot cycle since the linear expansion of the heat sink is increased and the difference of the linear expansion between the insulation circuit board and the heat sink. Therefore, the thickness $T1$ of the first metal layer and the thickness T2 of the second metal layer are set to be 3.0 mm or less.

An insulation circuit board with a heat sink according to a second aspect of the present invention is provided with an insulation circuit board provided with a ceramic substrate, a circuit layer bonded on one side of the ceramic substrate, and a metal layer made of copper or copper alloy bonded on the other side of the ceramic substrate; and a heat sink bonded on the metal layer. The heat sink has a first metal layer bonded on the metal layer, made of aluminum or aluminum alloy with a thickness T1, a ceramic board material bonded on the first metal layer at an opposite side to the metal layer, and a second metal layer with a thickness T2 made of aluminum or aluminum alloy bonded on the ceramic board material at an opposite side to the first metal layer; and $0.2 \leq T1 \leq 0.5$ (mm), $0.3 \leq T2 \leq 0.6$ (mm), and a thickness ratio $T1/T2<1.0$.

In the insulation circuit board with a heat sink having such a configuration, the bondability of the insulation circuit board and the heat sink is deteriorated in a case in which the thickness T1 of the first metal layer is less than 0.2 mm. This is considered that because Si contained in brazing material is diffused when the ceramic board material and the first metal layer are bonded, and irregularities are formed on a surface of the first metal layer at the insulation circuit board side. In a case in which the thickness T1 of the first metal layer is more than 0.5 mm, a case in which the thickness T2 of the second metal layer is out of a range $0.3 \leq T2 \leq 0.6$ (mm), or a case in which the thickness ratio T1/T2 is 1.0 or more, the warping change amount is a negative value, and a value thereof is increased. This means that the insulation circuit board with the heat sink is largely deformed to be convex toward the heat sink side from being convex toward the circuit layer side when changing high temperature 285° C. to low temperature 30° C. In such a case, since compressive stress is applied on an outer peripheral part of the solder under the element, the bondability of the solder under the element is deteriorated when the cold/hot cycle is added.

As a preferable aspect of the insulation circuit board with a heat sink of the present invention, it is preferable that the circuit layer be made of copper or copper alloy, and the ceramic substrate and the ceramic board material be made of silicon nitride.

As a preferable aspect of the insulation circuit board with a heat sink of the present invention, it is preferable that the metal layer and the first metal layer be solid phase diffusion bonded.

Advantageous Effects of Invention

According to the present invention, warping of the insulation circuit board with a heat sink that is formed by bonding the insulation circuit board having a metal layer and the heat sink having a metal layer with a different composition from that of the metal layer of the insulation circuit board can be suppressed.

DESCRIPTION OF EMBODIMENTS

First Embodiment

Below, a first embodiment of the present invention will be explained referring drawings.
—Schematic Configuration of Insulation Circuit Board—

Figure 1:
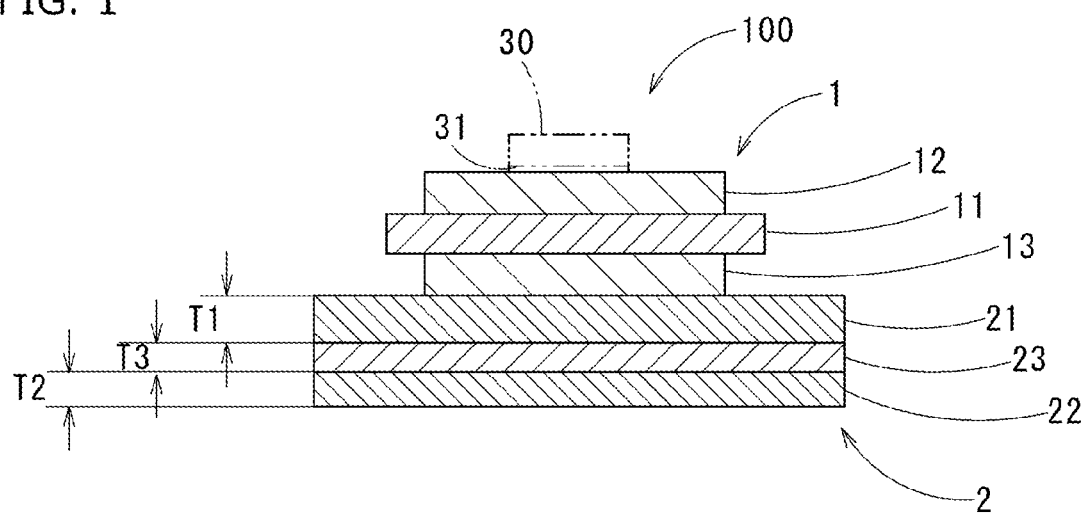
FIG. 1 is a cross sectional view showing a power module using an insulation circuit board with a heat sink according to a first embodiment of the present invention.

An insulation circuit board 100 with a heat sink is formed by bonding a heat sink 2 on an insulation circuit board 1 as shown in FIG. 1, and used as a power module substrate, for example. In this case, as shown by a two-dot chain line in FIG. 1, an element 30 is mounted on the insulation circuit board 100 with the heat sink as a power module substrate to be a power module.

The element 30 is an electronic component provided with a semiconductor, selected to from various semiconductor elements such as IGBT (Insulated Gate Bipolar Transistor), MOSFET (Metal Oxide Semiconductor Field Effect Transistor), FWD (Free Wheeling Diode), and the like.

In this case, the element 30 is provided with a top electrode part on a top part and a bottom electrode part on a bottom part though illustration is omitted, and the bottom electrode part is bonded on a circuit layer 12 with solder 31 or the like, so that the element 30 is mounted on the circuit layer 12. The top electrode part of the element 30 is connected to a circuit electrode part or the like of the circuit layer 12 via a lead frame or the like bonded with solder or the like, so that the power module is manufactured.
—Configuration of Insulation Circuit Board—

The insulation circuit board 1 is provided with a ceramic substrate 11, the circuit layer 12 joined to one side of the ceramic substrate 11, and a metal layer 13 joined to the other side of the ceramic substrate 11.

The ceramic substrate 11 is an insulation substrate with a rectangular board shape for preventing electric connection between the circuit layer 12 and the metal layer 13, formed from silicon nitride ($Si_3N_4$), aluminum nitride (AlN), aluminum oxide ($Al_2O_3$), zirconia-reinforced alumina substrate or the like, for example, and has a thickness of 0.2 mm to 1.2 mm. In a case in which both the circuit layer 12 and the metal layer 13 joined to both sides of the ceramic substrate 11 are made of copper or copper alloy, it is preferably made of silicon nitride.

A planar size of the ceramic substrate 11 is not specifically limited, though it is set to 40 mm to 140 mm×40 mm to 100 mm in the present embodiment.

The circuit layer 12 is joined to an upper surface (the one side) of the ceramic substrate 11 using copper of purity 99% by mass or more or copper alloy, and has a thickness of 0.2 mm to 2.0 mm inclusive, for example.

A planar size of the circuit layer 12 is smaller than that of the ceramic substrate 11, and set to 36 mm to 136 mm×36 mm to 96 mm in the present embodiment, though is not specifically limited.

The metal layer 13 is joined on a lower surface (the other side) of the ceramic substrate 11, and copper of purity 99% by mass or more or copper alloy can be used. A thickness thereof is 0.2 mm to 2.0 mm inclusive, for example.

A planar size of the metal layer 13 is smaller than that of the ceramic substrate 11, set to 36 mm to 136 mm×36 mm to 96 mm in the present embodiment, though is not specifically limited. The circuit layer 12 and the metal layer 13 preferably have the same composition, the same thickness, and the same size.

—Configuration of Heat Sink—

The heat sink 2 is joined to the insulation circuit board 1 to dissipate heat transmitted from the insulation circuit board 1. The heat sink 2 is formed from a first metal layer 21 joined to the metal layer 13 of the insulation circuit board 1, a ceramic board material 23 joined to a bottom surface of the first metal layer 21 (an opposite side to the metal layer 13), and a second metal layer 22 joined to a bottom surface of the ceramic board material 23 (an opposite side to the first metal layer 21).

The first metal layer 21 is made of aluminum or aluminum alloy: for example, A6063 alloy by JIS standard is mainly used, and 4N—Al, A3003, ADC12 and the like are also used. A thickness T1 of the first metal layer 21 of the present embodiment is set to 0.8 mm to 3.0 mm inclusive. The second metal layer 22 is made of aluminum or aluminum alloy, and has a thickness T2 of 0.8 mm to 3.0 mm inclusive.

If the thickness T1 of the first metal layer 21 is more than 3.0 mm, an influence of to expansion of the first metal layer 21 made of aluminum or aluminum alloy increases, and linear expansion of the heat sink 2 in which the first metal layer 21 is joined to the ceramic board material 23 increases; as a result, in cold/hot cycle, the ceramic substrate 11 of the insulation circuit board 1 of the insulation circuit board 100 with the heat sink in which the insulation circuit board 1 and the heat sink 2 are joined may be broken. Similarly in the second metal layer 22, if the thickness T2 is more than 3.0 mm, there is a possibility that the ceramic substrate 11 is broken in the cold/hot cycle.

If either one of the thickness T1 of the first metal layer 21 or the thickness T2 of the second metal layer 22 is less than 0.8 mm or if a thickness ratio T1/T2 is less than 1.0, a warping change amount is a negative value, and the value is also large. This means that the insulation circuit board with a heat sink is largely deformed to be convex in a direction towards the heat sink 2 side from convex towards the circuit layer 12 side when changing form high temperature 285° C. to low temperature 30° C. In such a case, compressive stress is added on an outer peripheral part of the solder 31 under the element 30, so that a bonded rate of the solder 31 under the element 30 is deteriorated when the cold/hot cycle is applied.

The ceramic board material 23 is provided for reducing a difference of linear expansion between the heat sink 2 and the insulation circuit board 1, and made of aluminum nitride (AlN), silicon nitride (Si3N4), oxide aluminum (Al2O3), zirconia-reinforced alumina substrate or the like, with a thickness T3 of 0.2 mm to 1.2 mm. The ceramic board material 23 is preferably made of silicon nitride since the first metal layer 21 and the second metal layer 22 made of aluminum or aluminum alloy are joined to both the surfaces.

The planar sizes of the first metal layer 21, the second metal layer 22, and the ceramic board material 23 are larger than that of the ceramic substrate 11 and set to the same size though not specifically limited, set to 50 mm to 180 mm×60 mm to 140 mm for example.

Figure 2:
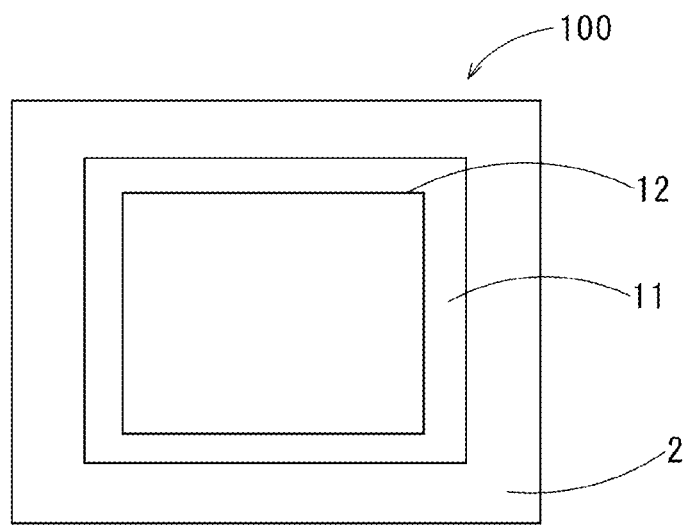
FIG. 2 is a planar view of the insulation circuit board with a heat sink in the first embodiment viewed from a circuit layer side.

Therefore, when the insulation circuit board 100 with the heat sink is viewed from the circuit layer 12 side, as shown in FIG. 2, the ceramic substrate 11 is larger than the circuit layer 12, and the heat sink 2 (the first metal layer 21, the second metal layer 22 and the ceramic board material 23) is larger than the ceramic substrate 11.

As explained above, the heat sink 2 has a configuration in which the ceramic board material 23 is arranged between the first metal layer 21 and the second metal layer 22 which are made of aluminum or aluminum alloy.

—Method of Manufacturing Insulation Circuit Board with Heat Sink—

Next, a method of manufacturing the insulation circuit board 100 with the heat sink according to the present embodiment will be explained.

Figure 3A:
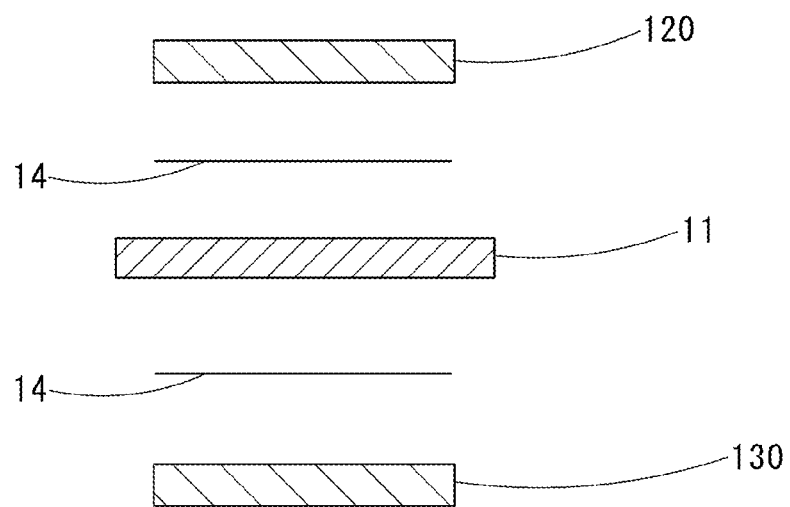
FIG. 3A is a cross sectional view explaining a method of manufacturing the insulation circuit board with a heat sink shown in FIG. 1.
Figure 3B:
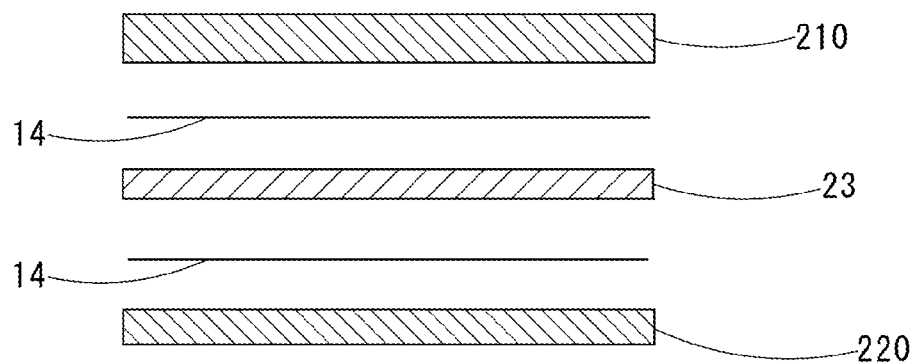
FIG. 3B is a cross sectional view explaining a method of manufacturing the insulation circuit board with a heat sink shown in FIG. 1.
Figure 3C:
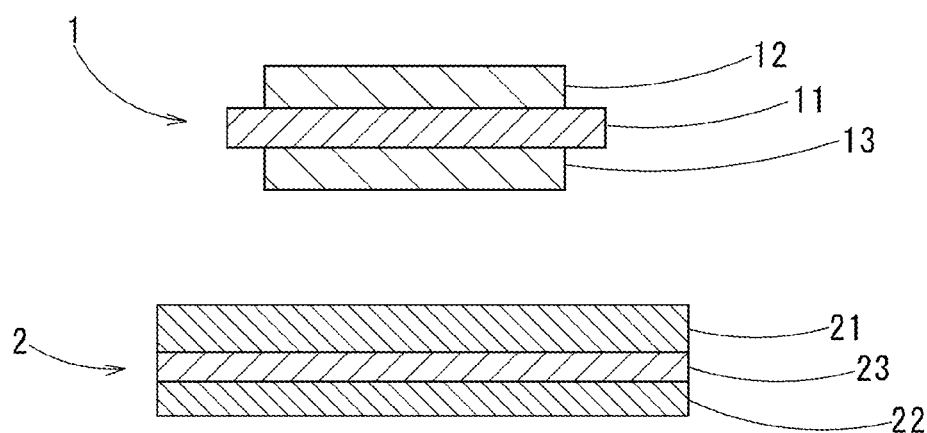
FIG. 3C is a cross sectional view explaining a method of manufacturing the insulation circuit board with a heat sink shown in FIG. 1.

As shown in FIGS. 3A to 3C, the method of manufacturing the insulation circuit board 100 with the heat sink has a manufacturing step of the insulation circuit board bonding a metal board 120 for the circuit layer and a metal board 130 for the metal layer which are made of copper or copper alloy on the ceramic substrate 11 (FIG. 3A), a manufacturing step of the heat sink bonding a metal board 210 for a first metal layer and a metal board 220 for a second metal layer which are made of aluminum or aluminum alloy on the ceramic board material 23 (FIG. 3B), and a bonding step bonding the insulation circuit board 1 and the heat sink 2 (FIG. 3C). Below, the steps will be explained in order.

—Manufacturing Method of Insulation Circuit Board—

As shown in FIG. 3A, the metal board 120 for the circuit layer and the metal board 130 for the metal layer are joined to the ceramic substrate 11 using brazing material of Ag—Cu—Ti type respectively. Specifically, on both surfaces of the ceramic substrate 11, the metal board 120 for the circuit layer and the metal board 130 for the metal layer are laminated with brazing material foils 14 therebetween; and by a laminated body of them is held between carbon boards, and heated in vacuum with adding a load in a lamination direction, so that the metal board 120 for the circuit layer and the metal board 130 for the metal layer are joined to the ceramic substrate 11. Thereby, the circuit layer 12 is joined to the upper surface of the ceramic substrate 11 with a joined part (brazed part) therebetween and the metal layer 13 is joined to the lower surface with a joined part (brazed part) therebetween to form the insulation circuit board 1.

When the circuit layer 12 and the metal layer 13 are joined to the ceramic substrate 11, it is preferable that the pressing force in the lamination direction be 0.1 MPa to 1.0 MPa and heating temperature be 800° C. to 930° C. The Ag—Cu—Ti type brazing material foil preferably have a thickness of 5 μm to 15 μm. Other than Ag—Cu—Ti type brazing material, Cu—P type brazing material can be also used.

—Manufacturing Step of Heat Sink—

Next, as shown in FIG. 3B, the metal board 210 for the first metal layer having the thickness T1 of 0.8 mm to 3.0 mm and the metal board 220 for the second metal layer having the thickness T2 of 0.8 mm to 3.0 mm and equal to or less than T1 are respectively bonded on the ceramic board material 23 having a thickness T3 of 0.2 mm to 1.2 mm using Al—Si type brazing material.

Specifically, the metal board 210 for the first metal layer and the metal board 220 for the second metal layer are respectively laminated on both surfaces of the ceramic board material 23 with the Al—Si type brazing foils therebetween; and the metal board 210 for the first metal layer and the metal board 220 for the second metal layer are bonded on the ceramic board material 23 by holding a laminated body of them between carbon boards and heating in vacuum with adding a load in the lamination direction. Thereby, the first metal layer 21 having the thickness T1 of 0.8 mm to 3.0 mm is bonded on one surface (a top surface) of the ceramic board material 23 with a bonded part (brazed part) therebetween, and the first metal layer 21 having the thickness T2 of 0.8 mm to 3.0 mm and equal to or less than the thickness T1 is bonded on the other surface (a bottom surface) with a bonded part (brazed part) therebetween to form the heat sink 2.

When the metal board 210 for the first metal layer and the metal board 220 for the second metal layer are joined to the ceramic board material 23, it is preferable that the pressure force in the lamination direction be 0.3 MPa to 1.5 MPa and the heating temperature be 630° C. to 655° C. inclusive. Al—Si type brazing material foil preferably have a thickness 5 μm to 15 μm. Other than Al—Si type brazing material, Al—Ge type, Al—Cu type, Al—Mg type, Al—Mn type, or Al—Si—Mg type brazing material can be also used.

—Bonding Step—

Then, the insulation circuit board 1 and the heat sink 2 are solid phase diffusion bonded. Specifically, as shown in FIG. 3C, the metal layer 13 of the insulation circuit board 1 is laminated on the heat sink 2; and by pressing a laminated body of them in a lamination direction and heating to bonding temperature under vacuum atmosphere, the metal layer 13 and the first metal layer 21 of the heat sink 2 are solid phase diffusion bonded. In this case, for example, the pressing force in this case is 0.5 MPa to 2.0 MPa and the heating temperature is 500° C. to 540° C.; this state of pressing and heating is maintained for 30 minutes to 120 minutes. Thereby, the metal layer 13 and the heat sink 2 are bonded and the insulation circuit board 100 with the heat sink is obtained as shown in FIG. 1.

In the present embodiment, a bonded surface of the metal layer 13 and a bonded surface of the heat sink 2 are solid phase diffusion bonded, after removing flaws to be smooth in advance.

In a case in which a heat sink is formed from one board made of aluminum or aluminum alloy, since the difference of linear expansion is large from the metal layer 13 made of copper or copper alloy of the insulation circuit board 1, an expansion rate at high temperature and a contraction rate at low temperature is different, and warping of the insulation circuit board 100 with the heat sink is large.

By contrast, in the present embodiment, the heat sink 2 is formed from the first metal layer 21 joined to the metal layer 13 of the insulation circuit board 1, the ceramic board material 23 joined to the first metal layer 21, and the second metal layer 22 joined to the ceramic board material 23. That is to say, since the ceramic board material 23 is disposed between the first metal layer 21 and the second metal layer 22 which are made of aluminum or aluminum alloy, the linear expansion coefficient of the heat sink 2 can be small, and the difference of the linear expansion can be small from the insulation circuit board 1.

Since the thickness T1 of the first metal layer 21 is 0.8 mm to 3.0 mm inclusive and equal to or more than the thickness T2 of the second metal layer 22 (T1≥T2), while maintaining the heat dissipation effect of the heat sink 2, the warping change amount of the insulation circuit board 100 with the heat sink between at high temperature and at low temperature can be small either when the value is positive (a deformation from a shape swelling toward the heat sink side to a shape swelling toward the circuit layer side) or negative (a deformation from a shape swelling toward the circuit layer side to a shape swelling toward the heat sink side).

Second Embodiment

Next, a second embodiment of the present invention will be explained with referring drawings.

Figure 4:
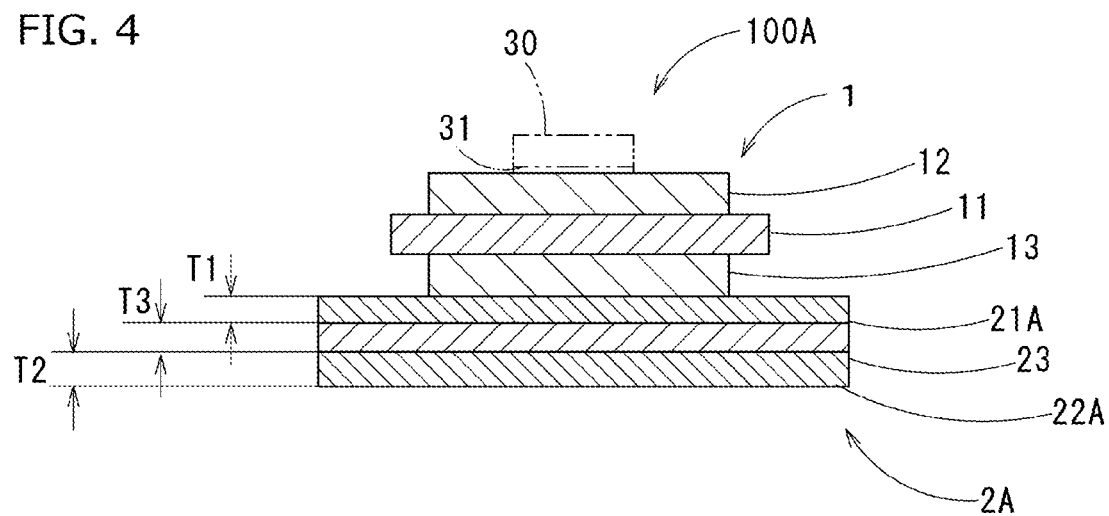
FIG. 4 is a cross sectional view showing a power module using an insulation circuit board with a heat sink according to a second embodiment of the present invention.

An insulation circuit board 100A with a heat sink of the present embodiment is to different from the above-described first embodiment in that a heat sink 2A is provided in place of the heat sink 2 as shown in FIG. 4. Hereinafter, parts that are the same as or substantially the same as those of the first embodiment are denoted by the same reference symbols, and the description thereof are omitted or simplified.

The heat sink 2A shown in FIG. 4 is set to have a thickness T1 of a first metal layer 21A of 0.2 mm to 0.5 mm inclusive, and a thickness T2 of a second metal layer 212 of 0.3 mm to 0.6 mm inclusive.

If the thickness T1 of the first metal layer is less than 0.2 mm, bondability of the insulation circuit board 1 and the heat sink 2A is deteriorated. This is considered that because Si contained in brazing material (an Al—Si type brazing material foil) is diffused when the ceramic board material 23 and the first metal layer 210 are bonded, and irregularities are formed on a surface of the first metal layer at the insulation circuit board 1 side. In a case in which the thickness T1 of the first metal layer is more than 0.5 mm, a case in which the thickness T2 of the second metal layer is out of a range 0.3≤T2≤0.6 (mm), or a case in which the thickness ratio T1/T2 is 1.0 or more, the warping change amount is a negative value, and a value thereof is increased. This means that the insulation circuit board with the heat sink is largely deformed to be convex toward the heat sink 2A side from being convex toward the circuit layer 12 side when changing high temperature 285° C. to low temperature 30° C. In such a case, since compressive stress is applied on an outer peripheral part of the solder 31 under the element 30, the bondability of the solder 31 under the element 30 is deteriorated when the cold/hot cycle is added.

Other detailed configurations are not limited to the configuration of the embodiments, and various modifications may be made without departing from the scope of the present invention.

For example, the circuit layer 12 is made of copper or copper alloy in the above-mentioned embodiments, but is not limited to this, it may be made of aluminum or aluminum alloy for example. That is to say, it does not matter what is the composition of the circuit layer 12.

In the above embodiments, examples of the insulation circuit boards 100 and 100A with a heat sink are used as power module substrates with a heat sink, while the insulation circuit boards 100 and 100A with a heat sink may be used as various type of insulation substrates such as a substrate for LED element and the like.

Examples

Next, effects of the present invention will be explained in details using examples, while the present invention is not limited to the following examples.

—Experiment Regarding First Aspect—

As insulation circuit boards forming test pieces of Examples 1-1 to 1-12, Comparative Examples 1-1 to 1-4, and Conventional Example, a circuit layer with a thickness of 0.4 mm and a metal layer with a thickness of 0.4 mm were manufactured on a ceramic substrate with a thickness of 0.635 mm and a planar size of 120 mm×90 mm by the manufacturing method described in the above-described embodiments. The circuit layer and the metal layer were prepared to have the composition shown in Table 1.

As heat sinks forming the test pieces of Examples 1-1 to 1-12 and Comparative Examples 1-1 to 1-4, a first metal layer and a second metal layer made of aluminum or aluminum alloy were bonded on a ceramic substrate with a thickness of 0.32 mm and a planar size of 140 mm×100 mm A bonding method followed the manufacturing method described in the above embodiments. The first metal layer and the second metal layer were prepared having the composition and the thickness shown in Table 1.

In the tables, OFC represents oxygen-free copper; A6063, A3003, and ADC12 represent aluminum alloy regulated by JIS (Japanese Industrial Standard), and 4N—Al represents what is called pure aluminum having purity of 99.99% or more.

For Conventional Example, a heat sink made of one board of aluminum alloy having a thickness of 5.0 mm and a planar size of 140 mm×100 mm was manufactured.

These insulation circuit boards and the heat sinks were bonded following the bonding method described in the above-mentioned embodiments, and the following experiments were carried out on the obtained test pieces.

—Warping Change Amount—

With respect to the obtained test pieces, in a sequential heating test of heating from normal temperature (30° C.) to 285° C. and then cooling to 30° C., a warping amount when heated to 285° C. and a warping amount when cooled to 30° C. after heated to 285° C. (a warping amount when cooled to 30° C.) were measured, and a change amount (a warping change amount) between the warping amount when heated to 285° C. and the warping amount when cooled to 30° C. was obtained.

The warping amounts were measured using a moiré-type three-dimensional shape measuring device (a thermal warpage and strain measurement device TherMoire PS200 made by Akrometrix, LLC), at a center of the second metal layer of the heat sink (an area of 100 mm×80 mm) as a measured surface. More specifically, a least-squares surface was found from a profile of the measured surface and the warping amount was obtained by finding a difference (absolute value) between a highest point and a lowest point on basis of the surface.

The warping amount obtained as above is set to be whether positive or negative in accordance with the warping condition. That is to say, it was set to be negative (−) in a case in which the center of the measured surface was nearer to the circuit layer side than a surface formed by four corners of the measured surface (the second metal layer was convex toward the circuit layer side); and it was set to be positive (+) in a case in which the center of the measured surface was on the surface formed by the four corners of the measured surface and a case in which the center of the measured surface was further from the circuit layer side than the surface formed by the four corners of the measured surface (the second metal layer was convex toward the heat sink side).

The warping change amount was obtained by a formula (the warping amount when heated to 285° C.−the warping amount when cooled to 30° C.). Signs for the warping change amount denote directions in change of the warping of the insulation circuit board with a heat sink: when it is a negative (−), it denotes a warping change from a state of being convex toward the circuit layer side to a state of being convex toward the heat sink side.

—Cold/Hot Cycle Reliability (Reliability of Solder under Element)—

With respect to Examples 1-1 to 1-12, Comparative Examples 1-1 to 1-3 and Conventional Example, 30 test pieces each having an electronic component soldered to the circuit layer were produced, and the bondability of solder was evaluated after carrying out thermal cycle test in which temperature was changed 1000 times between −50° C. to 175° C. As the solder, Sn-3Ag-0.5Cu solder was used. After the cycle test, a boundary surface between the electronic component and the solder was observed by ultrasonic flaw detecting and binarized, and black parts were determined as bonded parts; and a bonded rate was obtained when 100% was an area of the electronic component. The bonded rate was obtained for the 30 test pieces; it was evaluated "A" if an average value was 80% or more, or "B" if it was less than 80%.

—Evaluation of Ceramics Damage—

Test pieces were produced by soldering the electronic component on the circuit layer, and existence of damage in ceramics was checked. Among the element 30 test pieces, if one or more ceramic substrate of the insulation circuit board was damaged after soldering, it was evaluated bad "B"; and if none was damaged, it was evaluated as good "A".

—Evaluation of Cold/Hot Cycle Reliability (Damage of Ceramic Substrate)—

Regarding the element 30 insulation circuit boards with a heat sink for respective Examples 1-1 to 1-12, Comparative Examples 1-1 to 1-3, and Conventional Example, thermal cycle test changing 1000 times between −50° C. to 175° C. was carried out, and then it was judged whether damages on the ceramic substrate of the insulation circuit board were exist or not by sight. If 70% or more numbers of the ceramic substrates was damaged, it was evaluated bad "B"; and if less than 70% it was evaluated good "A".

Results of the warping change amount, the evaluation of the cold/hot cycle reliability (reliability of solder under the element), the evaluation of the ceramics damage, and the evaluation of the cold/hot cycle reliability were shown in Table 2.

TABLE 1

| | | | Insulation Substrate | | Heat Sink | | | | |
|---|---|---|---|---|---|---|---|---|---|
| | | | Circuit Layer | Ceramic Substrate | First Metal Layer | Metal Layer | Thickness T1 (mm) | Ceramic Board Material | Second Metal Layer | Thickness T2 (mm) | T1/T2 |
| Example | 1-1 | OFC | $Si_3N_4$ | OFC | A6063 | 1.0 | $Si_3N_4$ | A6063 | 0.8 | 1.25 |
| | 1-2 | OFC | $Si_3N_4$ | OFC | A6063 | 0.8 | $Si_3N_4$ | A6063 | 0.8 | 1.00 |
| | 1-3 | OFC | $Si_3N_4$ | OFC | A6063 | 3.0 | $Si_3N_4$ | A6063 | 0.8 | 3.75 |
| | 1-4 | OFC | $Si_3N_4$ | OFC | A6063 | 2.0 | $Si_3N_4$ | A6063 | 1.5 | 1.33 |
| | 1-5 | OFC | $Si_3N_4$ | OFC | A6063 | 3.0 | $Si_3N_4$ | A6063 | 2.5 | 1.20 |

TABLE 1-continued

|  |  | Insulation Substrate | | | Heat Sink | | | | |
|---|---|---|---|---|---|---|---|---|---|
|  |  | Circuit Layer | Ceramic Substrate | Metal Layer | First Metal Layer | Thickness T1 (mm) | Ceramic Board Material | Second Metal Layer | Thickness T2 (mm) | T1/T2 |
|  | 1-6 | OFC | $Si_3N_4$ | OFC | A3003 | 1.0 | $Si_3N_4$ | A3003 | 0.8 | 1.25 |
|  | 1-7 | OFC | $Si_3N_4$ | OFC | ADC12 | 1.0 | $Si_3N_4$ | ADC12 | 0.8 | 1.25 |
|  | 1-8 | OFC | $Si_3N_4$ | OFC | 4N—Al | 1.0 | $Si_3N_4$ | 4N—Al | 0.8 | 1.25 |
|  | 1-9 | OFC | $Si_3N_4$ | OFC | A6063 | 1.0 | AlN | A6063 | 0.8 | 1.25 |
|  | 1-10 | OFC | $Si_3N_4$ | OFC | A6063 | 1.0 | $Al_2O_3$ | A6063 | 0.8 | 1.25 |
|  | 1-11 | OFC | AlN | OFC | A6063 | 0.8 | $Si_3N_4$ | A6063 | 0.8 | 1.00 |
|  | 1-12 | OFC | $Al_2O_3$ | OFC | A6063 | 0.8 | $Si_3N_4$ | A6063 | 0.8 | 1.00 |
| Comparative Example | 1-1 | OFC | $Si_3N_4$ | OFC | A6063 | 0.8 | $Si_3N_4$ | A6063 | 0.6 | 1.33 |
|  | 1-2 | OFC | $Si_3N_4$ | OFC | A6063 | 3.5 | $Si_3N_4$ | A6063 | 0.8 | 4.38 |
|  | 1-3 | OFC | $Si_3N_4$ | OFC | A6063 | 3.5 | $Si_3N_4$ | A6063 | 2.5 | 1.40 |
|  | 1-4 | OFC | $Si_3N_4$ | OFC | A6063 | 0.8 | $Si_3N_4$ | A6063 | 1 | 0.80 |
| Conventional Example |  | OFC | $Si_3N_4$ | OFC | A6063 | 5.0 | — | — | — | — |

TABLE 2

|  |  | Warping Amount (mm) | | Warping Change | | Cold/Hot Cycle Reliability | |
|---|---|---|---|---|---|---|---|
|  |  | 285° C. Heated | 30° C. Cooled | Amount (mm) | Ceramics Damage | (Solder under Element) | (Ceramic Substrate) |
| Example | 1-1 | 0.47 | 0.16 | 0.31 | A | A | A |
|  | 1-2 | 0.50 | 0.14 | 0.36 | A | A | A |
|  | 1-3 | 0.84 | −0.51 | 1.35 | A | A | A |
|  | 1-4 | 0.67 | −0.19 | 0.86 | A | A | A |
|  | 1-5 | 0.85 | −0.62 | 1.47 | A | A | A |
|  | 1-6 | 0.18 | −0.18 | 0.36 | A | A | A |
|  | 1-7 | 0.30 | −0.11 | 0.41 | A | A | A |
|  | 1-8 | 0.63 | 0.39 | 0.24 | A | A | A |
|  | 1-9 | 0.15 | −0.31 | 0.46 | A | A | A |
|  | 1-10 | −0.40 | −0.84 | 0.44 | A | A | A |
|  | 1-11 | 0.83 | 0.37 | 0.46 | A | A | A |
|  | 1-12 | 0.95 | 0.51 | 0.44 | A | A | A |
| Comparative Example | 1-1 | −0.33 | 0.15 | −0.48 | A | B | A |
|  | 1-2 | 0.83 | −0.45 | 1.28 | A | A | B |
|  | 1-3 | 0.90 | −0.55 | 1.45 | A | A | B |
|  | 1-4 | −0.11 | 0.21 | −0.32 | A | B | A |
| Conventional Example |  | 1.29 | −1.96 | 3.25 | B | A | B |

As found from Table 1 and Table 2, in Examples 1-1 to 1-12, the warping change amount was small as 1.5 mm or less, and evaluations of the cold/hot cycle reliability (the reliability of the solder under the element), the ceramics damage, and the cold/hot reliability (the ceramic substrate) were all good "A".

From the results, it was found that T1/T2≥1 that is the thickness T1 of the first metal layer was equal to or more than the thickness T2 of the second metal layer was an effective range, in a case in which the thickness T1 of the first metal layer and the thickness T2 of the second metal layer of the heat sink were both 0.8 mm to 3.0 mm inclusive.

By contrast, in Comparative Examples 1-1 and 1-4, the warping change amount was negative and large; that is, the insulation circuit board with a heat sink largely deformed from being convex towards the circuit layer side to being convex towards the heat sink side when changing from high temperature 285° C. to low temperature 30° C. In such a state, compressive stress is applied on the outer peripheral part of the solder under the element, so that the bonded rate of the solder under the element was deteriorated when the cold/hot cycle was carried out. Therefore, the evaluation of the cold/hot cycle reliability (the reliability of the solder under the element) was "B".

Regarding Comparative Examples 1-2 and 1-3, although the cold/hot cycle reliability (the reliability of the solder under the element) and the ceramics damage were both evaluated good "A", the ceramic substrate was broken as a result of the above-mentioned cold/hot cycle test, so that the evaluation was bad "B". Therefore, it was found that an effective result could not be obtained if the thickness of the first metal layer was 3.5 mm.

In Conventional Example, although the cold/hot cycle reliability (the reliability of the solder under the element) was good, the warping change amount was large, and it was not possible to obtain good results either in the evaluation of the ceramics damage and the evaluation of the cold/hot cycle reliability (ceramic substrate).

—Experiment Regarding Second Aspect—

As insulation circuit boards forming test pieces of Examples 2-1 to 2-11 and Comparative Examples 2-1 to 2-6, which are the same as those in the experiment according to the first aspect, the circuit layer with a thickness of 0.4 mm and a metal layer with a thickness of 0.4 mm were manufactured on a ceramic substrate with a thickness of 0.635 mm and a planar size of 120 mm×90 mm by the manufacturing method described in the above-described embodiments. The circuit layer and the metal layer were prepared to have the composition shown in Table 3.

As heat sinks forming the test pieces of Examples 2-1 to 2-11 and Comparative Examples 2-1 to 2-6, a first metal layer and a second metal layer made of aluminum or aluminum alloy were bonded on a ceramic substrate with a thickness of 0.32 mm and a planar size of 140 mm×100 mm A bonding method followed the manufacturing method described in the above embodiments. The first metal layer and the second metal layer were prepared having the composition and the thickness shown in Table 3.

In the tables, OFC represents oxygen-free copper; A6063, A3003, and ADC12 represent aluminum alloys regulated by JIS (Japanese Industrial Standard), and 4N—Al represents what is called pure aluminum having purity of 99.99% or more.

These insulation circuit boards and the heat sinks were bonded following the bonding method described in the above-mentioned embodiments; and as in the experiments of the first aspect, the warping change amount and the cold/hot cycle reliability (the reliability of the solder under the element) were evaluated on the obtained test pieces; and moreover, bondability of the insulation circuit board and the heat sink was evaluated by the following method and results thereof were shown in Table 4.

—Evaluation of Bondability of Insulation Circuit Board and Heat Sink—

The bondability of the insulation circuit board and the heat sink was evaluated by observing the test pieces, at a bonded boundary surface of the metal layer of the insulation circuit board and the first metal layer of the heat sink using an ultrasonic image measuring device (an ultrasonic image measuring device IS-200 made by Insight k.k.) and measuring an area of voids at the bonded boundary surface. A total area of the voids to an area to be bonded was calculated as a void ratio of samples.

Void ratio (%)=[(the total area of the voids)/(an area of the metal layer 13)]×100

The "bondability" was evaluated good "A" if the void ratio was less than 5%; or evaluated bad "B" if the void ratio was more than 5%.

TABLE 3

|  |  | Insulation Circuit Board | | First | Thickness | Ceramic | Heat Sink Second | Thickness | | |
|---|---|---|---|---|---|---|---|---|---|---|
|  |  | Circuit Layer | Ceramic Substrate | Metal Layer | Metal Layer | T1 (mm) | Board Material | Metal Layer | T2 (mm) | T1/T2 | T1 + T2 (mm) |
| Example | 2-1 | OFC | Si$_3$N$_4$ | OFC | A6063 | 0.5 | Si$_3$N$_4$ | A6063 | 0.6 | 0.8 | 1.1 |
|  | 2-2 | OFC | Si$_3$N$_4$ | OFC | A6063 | 0.3 | Si$_3$N$_4$ | A6063 | 0.6 | 0.5 | 0.9 |
|  | 2-3 | OFC | Si$_3$N$_4$ | OFC | A6063 | 0.2 | Si$_3$N$_4$ | A6063 | 0.6 | 0.3 | 0.8 |
|  | 2-4 | OFC | Si$_3$N$_4$ | OFC | A6063 | 0.2 | Si$_3$N$_4$ | A6063 | 0.3 | 0.7 | 0.5 |
|  | 2-5 | OFC | Si$_3$N$_4$ | OFC | A3003 | 0.2 | Si$_3$N$_4$ | A3003 | 0.6 | 0.3 | 0.8 |
|  | 2-6 | OFC | Si$_3$N$_4$ | OFC | ADC12 | 0.2 | Si$_3$N$_4$ | ADC12 | 0.6 | 0.3 | 0.8 |
|  | 2-7 | OFC | Si$_3$N$_4$ | OFC | A1050 | 0.2 | Si$_3$N$_4$ | A1050 | 0.6 | 0.3 | 0.8 |
|  | 2-8 | OFC | Si$_3$N$_4$ | OFC | A6063 | 0.2 | AlN | A6063 | 0.6 | 0.3 | 0.8 |
|  | 2-9 | OFC | Si$_3$N$_4$ | OFC | A6063 | 0.2 | Al$_2$O$_3$ | A6063 | 0.6 | 0.3 | 0.8 |
|  | 2-10 | OFC | Si$_3$N$_4$ | OFC | 4N—Al | 0.2 | Si$_3$N$_4$ | A1050 | 0.6 | 0.3 | 0.8 |
|  | 2-11 | OFC | Si$_3$N$_4$ | OFC | A6063 | 0.6 | Si$_3$N$_4$ | A6063 | 0.7 | 0.9 | 1.3 |
| Comparative Example | 2-1 | OFC | Si$_3$N$_4$ | OFC | A6063 | 0.6 | Si$_3$N$_4$ | A6063 | 0.6 | 1.0 | 1.2 |
|  | 2-2 | OFC | Si$_3$N$_4$ | OFC | A6063 | 0.3 | Si$_3$N$_4$ | A6063 | 0.3 | 1.0 | 0.6 |
|  | 2-3 | OFC | Si$_3$N$_4$ | OFC | A6063 | 0.1 | Si$_3$N$_4$ | A6063 | 0.6 | 0.2 | 0.7 |
|  | 2-4 | OFC | Si$_3$N$_4$ | OFC | A6063 | 0.1 | Si$_3$N$_4$ | A6063 | 0.3 | 0.3 | 0.4 |
|  | 2-5 | OFC | Si$_3$N$_4$ | OFC | A6063 | 0.7 | Si$_3$N$_4$ | A6063 | 0.8 | 0.9 | 1.5 |
|  | 2-6 | OFC | Si$_3$N$_4$ | OFC | A6063 | 0.3 | Si$_3$N$_4$ | A6063 | 0.2 | 1.5 | 0.5 |

TABLE 4

|  |  | Warping Amount (mm) | | Warping Change | Bondability of Insulation Circuit | Cold/Hot Cycle |
|---|---|---|---|---|---|---|
|  |  | 285° C. Heated | 30° C. Cooled | Amount (mm) | Board and Heat Sink | Reliability (Solder under Element) |
| Example | 2-1 | 0.48 | 0.75 | −0.27 | A | A |
|  | 2-2 | 0.46 | 0.71 | −0.25 | A | A |
|  | 2-3 | 0.48 | 0.67 | −0.19 | A | A |
|  | 2-4 | 0.67 | 0.88 | −0.21 | A | A |
|  | 2-5 | 0.37 | 0.61 | −0.24 | A | A |
|  | 2-6 | 0.58 | 0.76 | −0.18 | A | A |
|  | 2-7 | 0.68 | 0.93 | −0.25 | A | A |
|  | 2-8 | 0.63 | 0.84 | −0.21 | A | A |
|  | 2-9 | 0.51 | 0.78 | −0.27 | A | A |
|  | 2-10 | 0.50 | 0.72 | −0.22 | A | A |
|  | 2-11 | 0.45 | 0.72 | −0.27 | A | A |
| Comparative Example | 2-1 | 0.65 | 0.96 | −0.31 | A | B |
|  | 2-2 | 0.81 | 1.17 | −0.36 | A | B |

TABLE 4-continued

| | Warping Amount (mm) | | Warping Change | Bondability of Insulation Circuit | Cold/Hot Cycle |
|---|---|---|---|---|---|
| | 285° C. Heated | 30° C. Cooled | Amount (mm) | Board and Heat Sink | Reliability (Solder under Element) |
| 2-3 | 0.74 | 0.62 | 0.12 | B | A |
| 2-4 | 0.60 | 0.69 | −0.09 | B | A |
| 2-5 | 0.65 | 0.96 | −0.31 | A | B |
| 2-6 | 0.39 | 0.75 | −0.36 | A | B |

As found from Table 3 and Table 4, in Examples 2-1 to 2-11, the warping change amount was small as 0.3 mm or less with an absolute value; and the bondability of the insulation circuit board and the heat sink, and the reliability of the cold/hot cycle (the reliability of the solder under the element) were both evaluated good "A".

From the results, it was found that an effective range is T1/T2<1.0 in a case in which the thickness T1 of the first metal layer is 0.2 mm to 0.5 mm inclusive and the to thickness T2 of the second metal layer is 0.3 mm to 0.6 mm inclusive in the heat sink.

While in Comparative Examples 2-1 and 2-2, the warping change amount is negative and a value thereof was large, so that the insulation circuit board with a heat sink largely deforms from being convex towards the circuit layer side to being convex towards the heat sink side when changing from high temperature 285° C. to low temperature 30° C. In such a state, compressive stress is applied on the outer peripheral part of the solder under the element, so that the bonded rate of the solder under the element was deteriorated when the cold/hot cycle was carried out. Therefore, the evaluation of the cold/hot cycle reliability (the reliability of the solder under the element) was "B".

Regarding Comparative Examples 2-3 and 2-4, although the cold/hot cycle reliability (the reliability of the solder under the element) was evaluated good "A", the bondability of the insulation circuit board and the heat sink was bad, so that the evaluation was bad "B". The reason thereof is considered that Si contained in brazing material is diffused when bonding the ceramic board material and the first metal layer since the thickness T1 of the first metal layer is small as 0.1 mm, irregularities are formed on a surface of the first metal layer at the insulation circuit board side.

In Comparative Examples 2-5 and Comparative Example 2-6, the warping change amount was negative and large as in Comparative Examples 2-1 and 2-2, it deformed so that compressive stress was applied on the outer peripheral part of the solder under the element when changing from high temperature 285° C. to low temperature 30° C., so that the cold/hot cycle reliability (the reliability of the solder under the element) was evaluated "B".

INDUSTRIAL APPLICABILITY

Warping of an insulation circuit board with a heat sink can be suppressed.

REFERENCE SIGNS LIST

1 Insulation circuit board
2 2A Heat sink
11 Ceramic substrate
12 Circuit board
13 Metal layer
14 Brazing material foil
21 21A First metal layer
22 22A Second metal layer
23 Ceramic board material
30 Element
31 Solder
100 100A Insulation circuit board with heat sink
120 Metal board for circuit layer
130 Metal board for metal layer
210 Metal board for first metal layer
220 Metal board for second metal layer

The invention claimed is:

1. An insulation circuit board with a heat sink comprising an insulation circuit board provided with a ceramic substrate, a circuit layer bonded on one side of the ceramic substrate, and a metal layer made of copper or copper alloy bonded on the other side of the ceramic substrate; and a heat sink bonded on the metal layer, wherein
the heat sink comprises a first metal layer bonded on the metal layer, made of aluminum alloy with a thickness T1, a ceramic board material bonded on the first metal layer at an opposite side to the metal layer, and a second metal layer with a thickness T2 made of aluminum or aluminum alloy bonded on the ceramic board material at an opposite side to the first metal layer, and
the thickness T1 of the first metal layer is not less than 1.0 mm and not more than 3.0 mm and the thickness T2 of the second metal layer is not less than 0.8 mm and not more than 3.0 mm and a thickness ratio T1/T2 is 1.2 or more, and
wherein a warping change is observed when cooled from 285° C. to 30° C. such that the change is a decrease of positive warping, a change from positive to negative warping, or an increase in negative warping, wherein warping convex toward the circuit layer side is set to be negative and warping convex toward the heatsink side is set to be positive, and wherein the warping change has an value of 1.5 mm or less.

2. The insulation circuit board with a heat sink according to claim 1, wherein
the circuit layer is made of copper of copper alloy, and the ceramic substrate and the ceramic board material are made of silicon nitride.

3. The insulation circuit board with a heat sink according to claim 1, wherein
the metal layer and the first metal layer are solid phase diffusion bonded.

4. The insulation circuit board with a heat sink according to claim 2, wherein
the metal layer and the first metal layer are solid phase diffusion bonded.

5. The insulation circuit board with a heat sink according to claim 1, wherein
the warping change has an value of 0.31 mm to 1.5 mm.

* * * * *